(12) United States Patent
Li

(10) Patent No.: US 12,046,518 B2
(45) Date of Patent: Jul. 23, 2024

(54) METHOD FOR MANUFACTURING FIN FIELD EFFECT TRANSISTOR

(71) Applicant: Shanghai Huali Integrated Circuit Corporation, Shanghai (CN)

(72) Inventor: Yong Li, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 406 days.

(21) Appl. No.: 17/693,183

(22) Filed: Mar. 11, 2022

(65) Prior Publication Data

US 2022/0293475 A1    Sep. 15, 2022

(30) Foreign Application Priority Data

Mar. 15, 2021   (CN) .......................... 202110273868.9

(51) Int. Cl.
   *H01L 21/8238*  (2006.01)
   *H01L 29/66*    (2006.01)
   *H01L 21/02*    (2006.01)
   *H01L 29/78*    (2006.01)

(52) U.S. Cl.
   CPC ........... *H01L 21/823821* (2013.01); *H01L 21/823814* (2013.01); *H01L 21/823878* (2013.01); *H01L 29/66795* (2013.01); *H01L 21/0228* (2013.01); *H01L 29/7848* (2013.01)

(58) Field of Classification Search
   CPC ..... H01L 21/823821; H01L 21/823814; H01L 21/823878; H01L 29/66795; H01L 21/0228; H01L 29/7848
   See application file for complete search history.

(56) References Cited

U.S. PATENT DOCUMENTS

2011/0189845 A1*  8/2011  Yamakawa ....... H01L 29/66621
                                                        438/589
2021/0050267 A1*  2/2021  Li ................... H01L 21/823418

* cited by examiner

*Primary Examiner* — Karen Kusumakar
*Assistant Examiner* — Adam S Bowen
(74) *Attorney, Agent, or Firm* — Banner & Witcoff, Ltd.

(57) ABSTRACT

The present application discloses a method for manufacturing a fin field effect transistor, comprising: step 1: forming fins; step 2, forming first gate structures; and step 3, forming source and drain areas, comprising: step 31: forming a second hard mask layer; step 32: opening a formation area of FinFET, and performing the first time etching on the second hard mask layer; step 33: performing the second time etching to form first grooves in the fins, wherein the second time etching vertically and horizontally etches the isolation dielectric layer, when the second groove is formed next to the exposed surfaces of the isolation dielectric layer, the exposed surfaces of the fins and the first polysilicon gate, as the result, the second groove forms a bridge path; step 34: forming a sacrificial sidewall to fully fill the bridge path; and step 35: filling the first groove with an epitaxial layer.

15 Claims, 11 Drawing Sheets

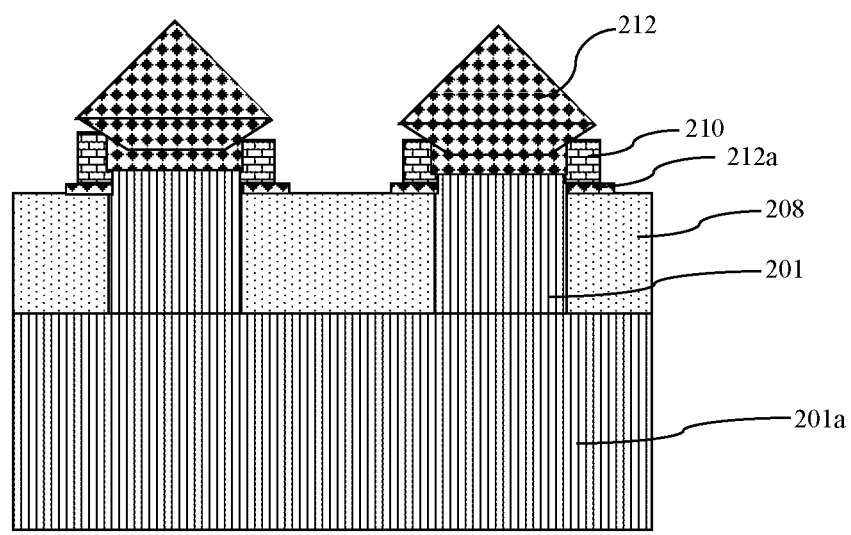
FIG. 6C1
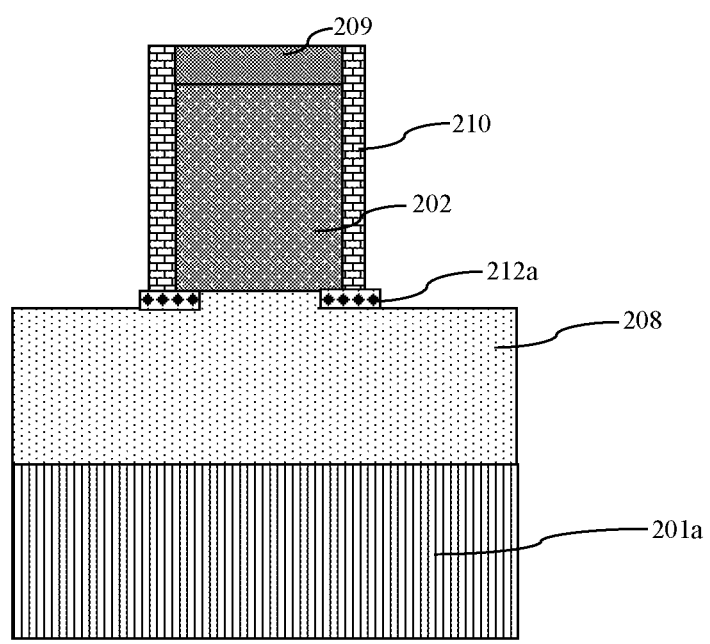
FIG. 6D1

METHOD FOR MANUFACTURING FIN FIELD EFFECT TRANSISTOR

CROSS-REFERENCES TO RELATED APPLICATIONS

This application claims the priority to Chinese patent application No. CN202110273868.9, filed on Mar. 15, 2021, and entitled "METHOD FOR MANUFACTURING FIN FIELD EFFECT TRANSISTOR", the disclosure of which is incorporated herein by reference in entirety.

TECHNICAL FIELD

The present application relates the field of semiconductor integrated circuit manufacturing, in particular, to a method for manufacturing a fin field effect transistor (FinFET).

BACKGROUND

With the development of the semiconductor process technology, the gate widths have been reduced continuously, and the conventional planar CMOS devices can no longer satisfy the technology requirements, one important issue being controlling the short channel effect. At a technology node below 20 nm, the fin field effect transistor structures have better electrical performance.

An embedded epitaxial layer has been introduced into the source area and drain areas of the fin field effect transistor, and the stress level of the channel area is changed by the embedded epitaxial layer in the source and drain areas, stress can improve the carrier mobility in the channel area, thereby improving the device performance. At the 90 nm technology node, an embedded silicon germanium (SiGe) epitaxial layer was introduced to improve the performance of the PMOS; and at the 14 nm technology node, an embedded SiP epitaxial layer is introduced to improve the performance of the NMOS. In order to further improve the stress function of the channel area, generally, it is necessary to increase the volume of the embedded epitaxial layer. However, any increase in the volume of the embedded epitaxial layer may lead to the risk of generating a bridge between the gate and the embedded epitaxial layer of the source and drain areas, i.e., the source-drain epitaxial layer, thereby degrading the performance of the device.

BRIEF SUMMARY

The present application provides a method for avoiding generating a bridge between the source-drain epitaxial layer and the gate during manufacturing the fin field effect transistor.

The method for manufacturing a fin field effect transistor provided by the present application comprises the following steps:
step 1: forming a fin on a semiconductor substrate, wherein a spacing area is provided between the fins, the spacing area is filled with an isolation dielectric layer, the top surface of the isolation dielectric layer is lower than the top surface of the fin, the fin is longitudinally divided into a bottom portion and a top portion that are stacked up in sequence, the top portion is located above the top surface of the isolation dielectric layer, and the bottom portion is located below the top surface of the isolation dielectric layer;
step 2: forming a first gate structure, wherein the first gate structure is formed by stacking a first gate dielectric layer and a first polysilicon gate, the top surface of the first polysilicon gate is provided with a first hard mask layer, a formation area of the first gate structure is defined by the first hard mask layer,
the first gate structure covers the top surface and side surface of the fin in a gate formation area, and the first gate structure extends to the surface of the isolation dielectric layer in the spacing area; and
step 3: forming a source area and a drain area in the fin on two sides of the first gate structure, comprising the following sub-steps:
step 31: forming a second hard mask layer, wherein the second hard mask layer covers the side surface of the first gate structure, the top surface of the first hard mask layer, the top surface and side surface of the fin outside the first gate structure, and the surface of the isolation dielectric layer outside the first gate structure;
step 32: opening a formation area of the fin field effect transistor, and performing first time full area etching on the second hard mask layer, wherein the first time full area etching removes the second hard mask layer on the top surface of the fin to expose the surface of the fin, and the first time full area etching also removes the second hard mask layer on the surface of the isolation dielectric layer to expose the surface of the isolation dielectric layer;
step 33: performing second time etching by using the second hard mask layer as a mask, wherein the second time etching etches the exposed fin to form a first groove,
the second time etching longitudinally and laterally etches the isolation dielectric layer with the exposed surface to form a second groove, the bottom surface of the second groove is lower than the bottom surface of the second hard mask layer, and the second groove extends laterally to a position directly below the bottom surface of the second hard mask layer and to a position directly below the bottom surface of the first polysilicon gate, to expose both the side surface of the bottom portion of the fin and the bottom surface of the first polysilicon gate and form a bridge path;
step 34: forming a sacrificial sidewall on the side surface of the second groove, wherein the sacrificial sidewall fully fills the bridge path; and
step 35: filling the first groove with an epitaxial layer to form an embedded epitaxial layer, and performing source and drain doping in the embedded epitaxial layer to form the source area and the drain area.

In a further improvement, the semiconductor substrate comprises a silicon substrate.

In a further improvement, the isolation dielectric layer is a shallow trench isolation oxide layer.

In a further improvement, the first hard mask layer is formed by stacking a first oxide layer and a first nitride layer.

In a further improvement, the second hard mask layer is formed by stacking a second oxide layer and a second nitride layer.

In a further improvement, in step 34, the step of forming the sacrificial sidewall comprises:
fully depositing a material layer of the sacrificial sidewall; and
full area etching the material layer of the sacrificial sidewall to form the sacrificial sidewall.

In a further improvement, a process of depositing the material layer of the sacrificial sidewall is an ALD process.

In a further improvement, the material of the material layer of the sacrificial sidewall comprises oxide, nitride, nitrogen oxide, or a low-K material.

In a further improvement, in step 2, the first gate dielectric layer comprises a gate oxide layer or a high dielectric-constant layer.

In a further improvement, the fin field effect transistor comprises an N-type fin field effect transistor and a P-type fin field effect transistor.

In a further improvement, if the fin field effect transistor is an N-type fin field effect transistor, the embedded epitaxial layer is an embedded SiP epitaxial layer, and the source area and the drain area are both subjected to N-type heavy doping.

In a further improvement, if the fin field effect transistor is a P-type fin field effect transistor, the embedded epitaxial layer is an embedded SiGe epitaxial layer, and the source area and the drain area are both subjected to P-type heavy doping.

In a further improvement, if the N-type fin field effect transistor and the P-type fin field effect transistor are both integrated on the semiconductor substrate, the source and drain areas of the N-type fin field effect transistor and the source and drain areas of the P-type fin field effect transistor are formed sequentially in step 3.

During formation of the source and drain areas of the N-type fin field effect transistor, in step 32, a formation area of the N-type fin field effect transistor is opened and a formation area of the P-type fin field effect transistor is covered.

During formation of the source and drain areas of the P-type fin field effect transistor, in step 32, the formation area of the P-type fin field effect transistor is opened and the formation area of the N-type fin field effect transistor is covered.

In a further improvement, the fin is formed by etching the semiconductor substrate in step 1, and in a top view, the fins present strip structures parallel to each other.

In a further improvement, in step 2, the first gate structures on the same row are connected together to form a gate structure row; and in the top view, the gate structure row and each of the fins are perpendicular to each other.

In the present application, after the etching of the first groove of the embedded epitaxial layer in the source and drain areas and before the filling with the epitaxial layer, the sacrificial sidewall is provided to fill the bridge path, so as to prevent formation of the epitaxial layer in the bridge path in an epitaxial filling process of the first groove, finally avoiding a bridge between the source-drain epitaxial layer and the gate, and thereby preventing the device performance from degrading.

BRIEF DESCRIPTION OF THE DRAWINGS

The present application will be further described in detail below with reference to the drawings and specific implementations:

FIG. 6C1 is a cross sectional view of the structural diagram, according to an existing method for manufacturing a fin field effect transistor, at the same position as that in FIG. 6C in the case of an epitaxially formed embedded layer.

FIG. 6D1 is a cross sectional view of the structural diagram, according to the existing method for manufacturing a fin field effect transistor, at the same position as that in FIG. 6D in the case of an epitaxially formed embedded layer.

DETAILED DESCRIPTION OF THE DISCLOSURE

Figure 1:
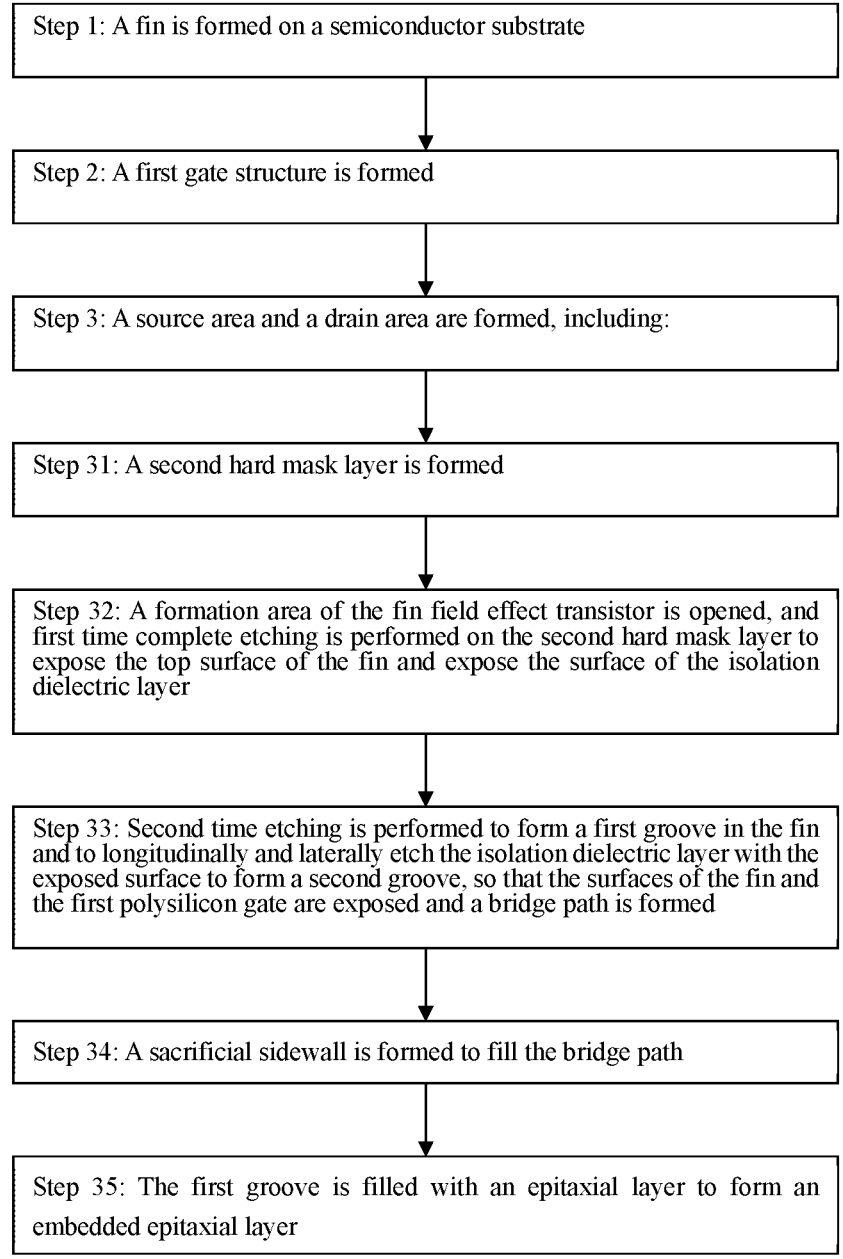
FIG. 1 shows a flowchart of a method for manufacturing a fin field effect transistor according to an embodiment of the present application.
Figure 2:
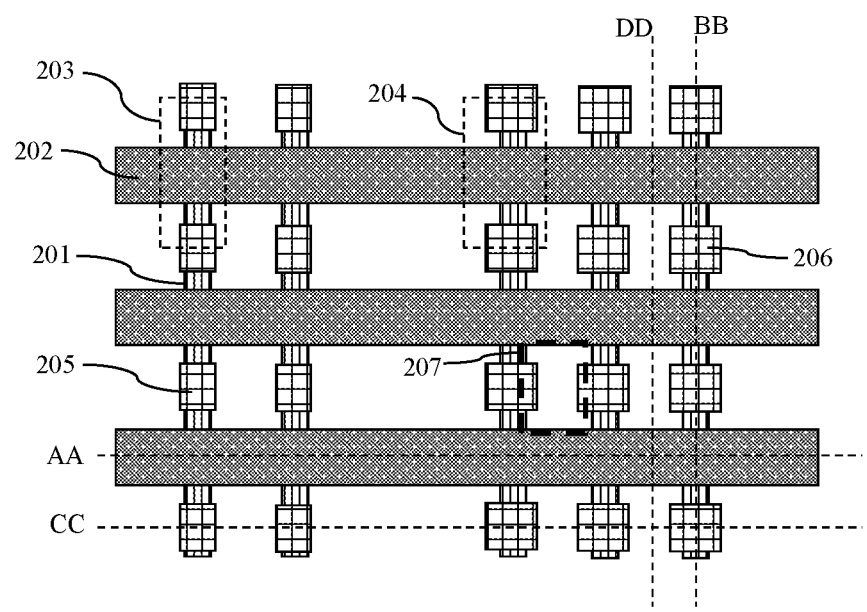
FIG. 2 is a plan view of a fin field effect transistor formed by the method for manufacturing the fin field effect transistor according to the embodiment of the present application.

FIG. 1 is a flowchart of a method for manufacturing a fin field effect transistor according to an embodiment of the present application. FIG. 2 is a plan view of a fin field effect transistor formed by the method for manufacturing a fin field effect transistor according to the embodiment of the present application. FIG. 3A, FIG. 4A, FIG. 5A, and FIG. 6A are cross sectional views of the structural diagrams along a dashed line AA in FIG. 2 during steps in manufacturing the fin field effect transistor according to the embodiment of the present application. FIG. 3B, FIG. 4B, FIG. 5B, and FIG. 6B are cross sectional views of the structural diagrams along a dashed line BB in FIG. 2 during steps in manufacturing the fin field effect transistor according to the embodiment of the present application. FIG. 3C, FIG. 4C, FIG. 5C, and FIG. 6C are cross sectional views of the structural diagrams along a dashed line CC in FIG. 2 during steps in manufacturing the fin field effect transistor according to the embodiment of the present application. FIG. 3D, FIG. 4D, FIG. 5D, and FIG. 6D are cross sectional views of the structural diagrams along a dashed line DD in FIG. 2 during steps in manufacturing the fin field effect transistor according to the embodiment of the present application. The method for manufacturing a fin field effect transistor according to the embodiment of the present application includes the following steps.

Figure 3A:
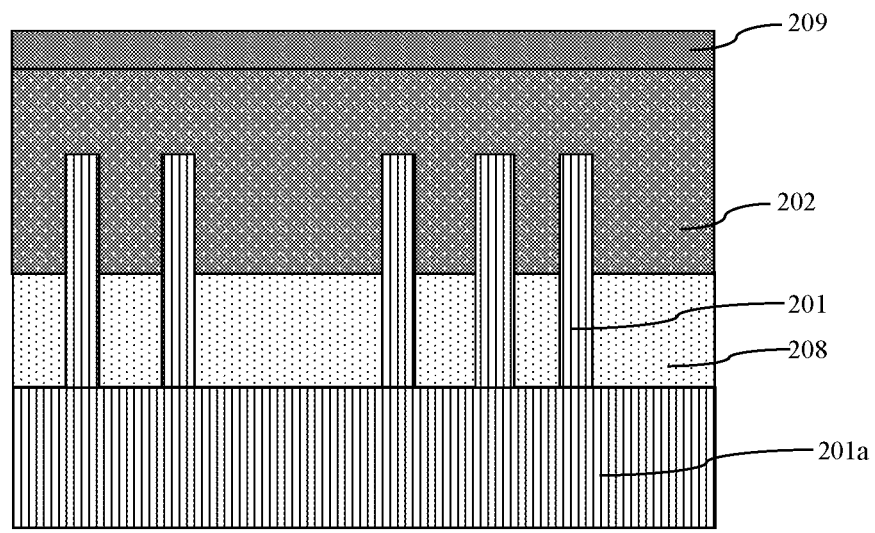
FIG. 3A, FIG. 4A, FIG. 5A, and FIG. 6A are cross sectional views of the structural diagrams along a dashed line AA in FIG. 2 during steps in manufacturing the fin field effect transistor according to the embodiment of the present application.

Step 1: Referring to FIGS. 2 and 3A, a fin 201 is formed on a semiconductor substrate 201a, there is a spacing area provided between two adjacent fins 201, the spacing area is filled with an isolation dielectric layer 208. The top surface of the isolation dielectric layer 208 is arranged lower than the top surface of each of the fins 201. Each of the fins 201 is longitudinally (perpendicular to the fin's height) divided into a bottom portion and a top portion, the top portion is located above the top surface of the isolation dielectric layer 208, and the bottom portion is located below the top surface of the isolation dielectric layer 208.

In the embodiment of the present application, the semiconductor substrate 201*a* includes a silicon substrate.

The isolation dielectric layer 208 is a shallow trench isolation oxide layer.

Each of the fins 201 is formed by etching the semiconductor substrate 201*a*, and referring to FIG. 2, in a top view, the fins 201 present strip structures parallel to each other.

Step 2: Referring to FIGS. 2 and 3A, a first gate structure is formed, wherein the first gate structure is formed by stacking a first gate dielectric layer (not shown) and a first polysilicon gate 202, the top surface of the first polysilicon gate 202 is provided with a first hard mask layer 209, and a formation area of the first gate structure is defined by the first hard mask layer 209.

The first gate structure covers the top surface and side surfaces of each of the fins 201 in a gate formation area, and the first gate structure extends to the surface of the isolation dielectric layer 208 in the spacing area.

In the embodiment of the present application, the fin field effect transistor comprises an N-type fin field effect transistor and a P-type fin field effect transistor. In FIG. 2, a dashed line box 203 corresponds to a formation area of the N-type fin field effect transistor, and a dashed line box 204 corresponds to a formation area of the P-type fin field effect transistor.

Figure 3B:
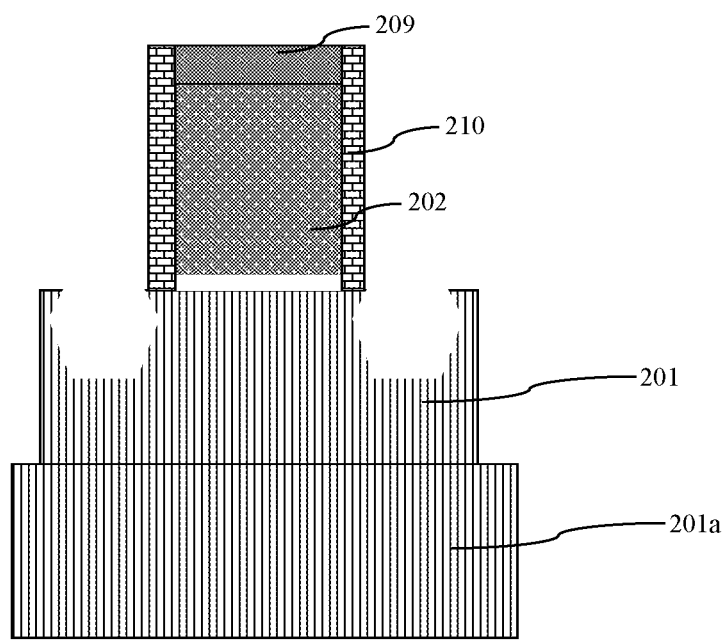
FIG. 3B, FIG. 4B, FIG. 5B, and FIG. 6B are cross sectional views of the structural diagrams along a dashed line BB in FIG. 2 during steps in manufacturing the fin field effect transistor according to the embodiment of the present application.

FIG. 3B illustrates a cross sectional view of the structural diagram of the formation area of the P-type fin field effect transistor along the dashed line BB. FIG. 3B illustrates a cross sectional view of the first polysilicon gate 202 along the width direction thereof; wherein the top surface of the first polysilicon gate 202 is provided with the first hard mask layer 209.

Figure 3C:
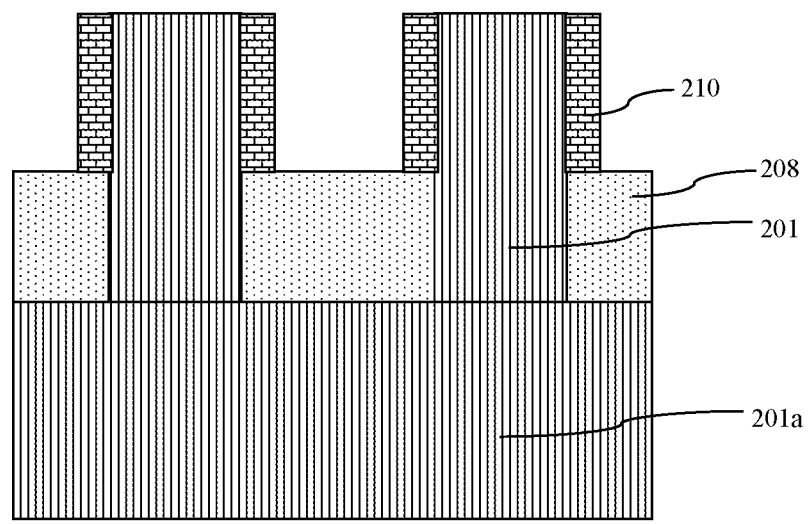
FIG. 3C, FIG. 4C, FIG. 5C, and FIG. 6C are cross sectional views of the structural diagrams along a dashed line CC in FIG. 2 during steps in manufacturing the fin field effect transistor according to the embodiment of the present application.

FIG. 3C illustrates a cross sectional view of the structural diagrams along the dashed line CC, including two fins 201, wherein the first polysilicon gate 202 is not formed in a corresponding area in FIG. 3C.

Figure 3D:
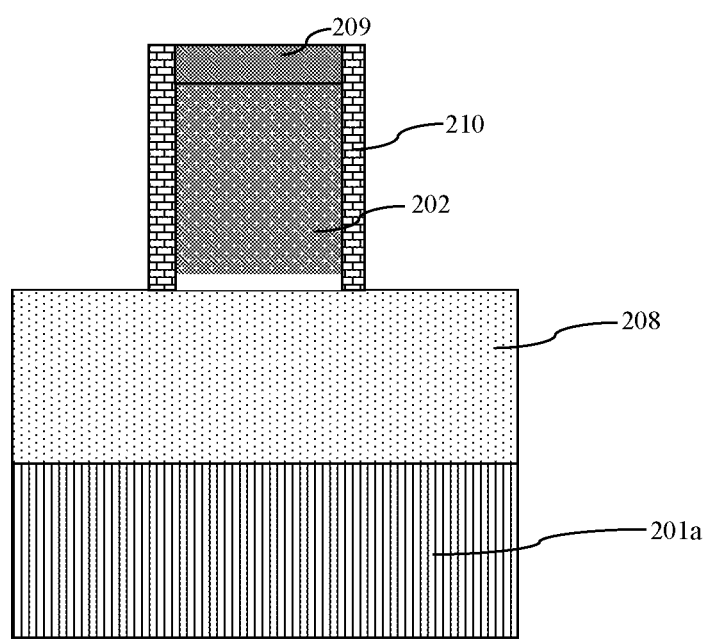
FIG. 3D, FIG. 4D, FIG. 5D, and FIG. 6D are cross sectional views of the structural diagrams along a dashed line DD in FIG. 2 during steps in manufacturing the fin field effect transistor according to the embodiment of the present application.

FIG. 3D illustrates a cross sectional view of the structural diagrams along the dashed line DD, including one first polysilicon gate 202. FIG. 3D also illustrates a cross sectional view of the structural diagrams of the first polysilicon gate 202 along the width direction thereof. However, the first polysilicon gate 202 in FIG. 3D is formed on the surface of the isolation dielectric layer 208, and the first polysilicon gate 202 in FIG. 3B is formed on the surface of the fin 202.

In the embodiment of the present application, the first hard mask layer 209 is formed by stacking a first oxide layer and a first nitride layer.

The first gate dielectric layer includes a gate oxide layer or a high dielectric-constant layer.

Referring to FIG. 2, the first gate structures on the same row are connected together to form a gate structure row; and in the top view, the gate structure row and each of the fins 201 are perpendicular to each other.

Step 3: A source area and a drain area are formed in each of the fins 201 on two sides of the first gate structure, including the following sub-steps.

Step 31: A second hard mask layer 210 is formed, wherein the second hard mask layer 210 covers the side surface of the first gate structure, the top surface of the first hard mask layer 209, the top surface and side surface of each of the fins 201 outside the first gate structure, and the surface of the isolation dielectric layer 208 outside the first gate structure.

In the embodiment of the present application, the second hard mask layer 210 is formed by stacking a second oxide layer and a second nitride layer.

Step 32: A formation area of the fin field effect transistor is opened, and first time full area etching is performed on the second hard mask layer 210, wherein the first time full area etching removes the second hard mask layer 210 on the top surface of each of the fins 201 to expose the surface of each of the fins 201, and the first time full area etching also removes the second hard mask layer 210 on the surface of the isolation dielectric layer 208 (not shown in FIG. 3B) to expose part of the surface of the isolation dielectric layer 208.

FIG. 3A illustrates a cross sectional structure along the dashed line AA formed after step 32. In step 31, the second hard mask layer 210 is formed on the surface of the first hard mask layer 209. After the first time full area etching in step 32, the second hard mask layer 210 is removed from the surface of the first hard mask layer 209.

It can be seen from FIG. 3B that after the first time full area etching in step 32, the second hard mask layer 210 on the side surfaces of the first gate structure is retained, and the second hard mask layer 210 shown in FIG. 3B is located on the side surfaces of the first polysilicon gate 202.

Referring to FIG. 3C, in step 31, the second hard mask layer 210 is also formed on the surfaces of each of the fins 201 and on the surface of the isolation dielectric layer 208. After the first time full area etching in step 32, the second hard mask layer 210 is removed from the surfaces of each of the fins 201 and the surface of the isolation dielectric layer 208. In this way, in FIG. 3C, the second hard mask layer 210 is located on the side surface of each of the fins 201.

Referring to FIG. 3D, in step 31, the second hard mask layer 210 was also initially formed on the surface of the first hard mask layer 209 and on the surface of the isolation dielectric layer 208. After the first time full area etching in step 32, the second hard mask layer 210 is removed from the surface of the first hard mask layer 209 and the surface of the isolation dielectric layer 208 is removed. In this way, as shown in FIG. 3D, the second hard mask layer 210 remains on the side surfaces of the first polysilicon gate 202.

Figure 4A:
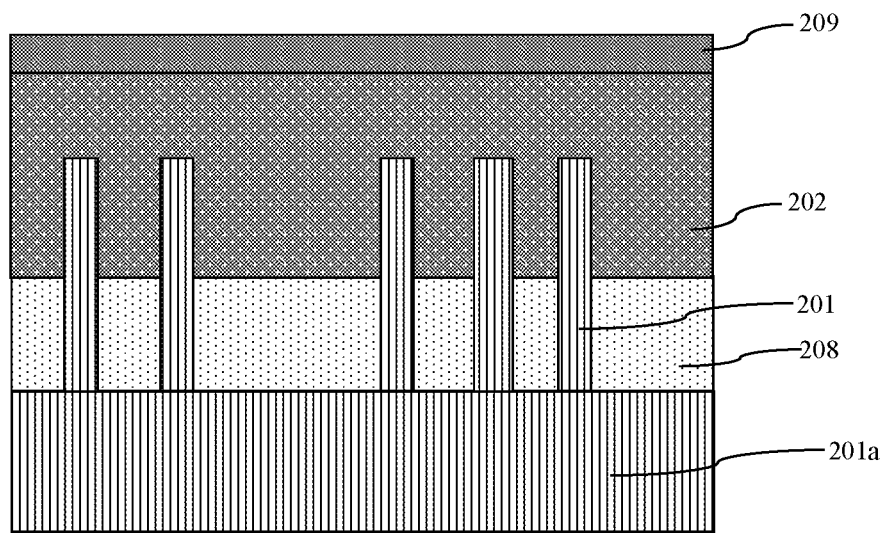
Figure 4B:
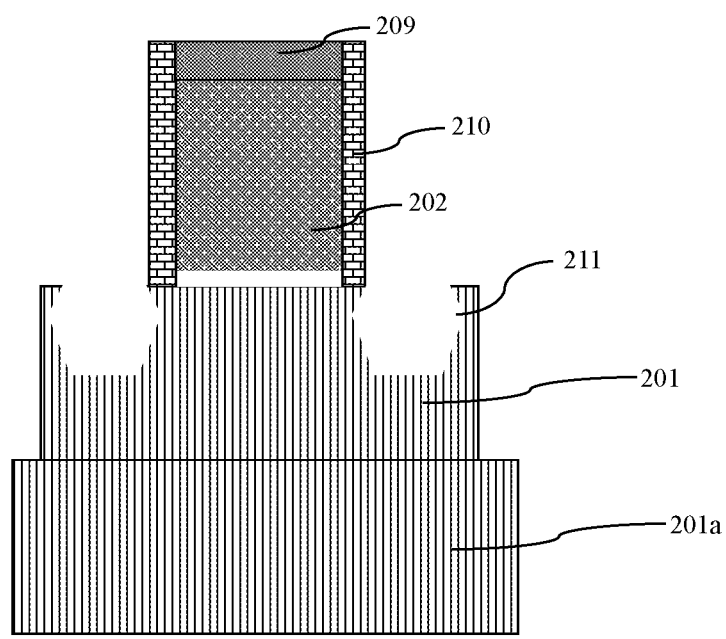
Figure 4C:
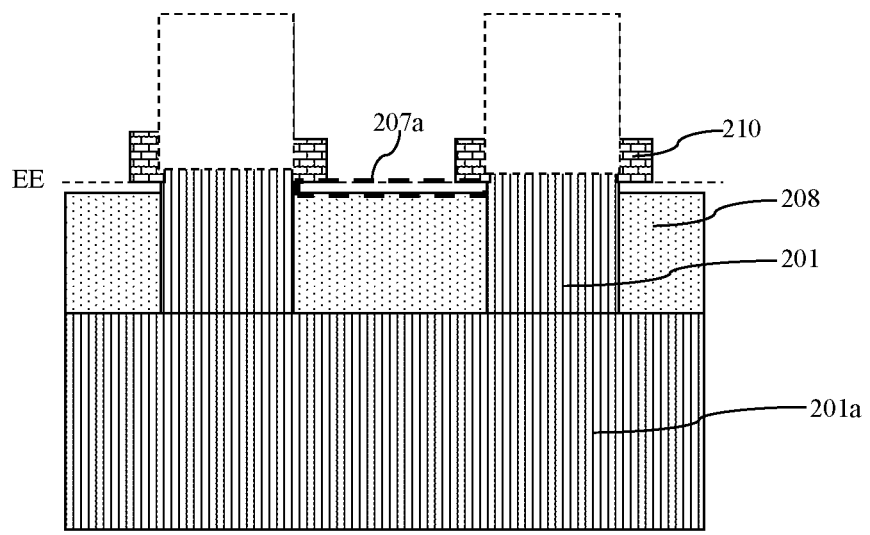

Step 33: Second time etching is performed by using the second hard mask layer 210, wherein the second time etching patterns the exposed fin 201 to form first grooves 211. Since the first grooves 211 are formed for only each of the fins 201 on two sides of the first polysilicon gate 202, the first grooves 211 are not shown in FIG. 4A. FIG. 4B illustrates a cross sectional view of the first grooves 211 along the dashed line BB. FIG. 4C illustrates a cross sectional structure of the first grooves 211 cut along the dashed line CC in FIG. 2. It can be seen from FIG. 4C that the top surface of the second hard mask layer 210 is removed to be lower than both two sides of one of the first grooves 211.

The second time etching etches the isolation dielectric layer 208 longitudinally (i.e. vertically) and horizontally, during this process a second hollow groove under the second hard mask layer 210 is formed, the exposed bottom surface of the second groove is arranged to be lower than the bottom surface of the second hard mask layer 210. The second groove extends laterally to a position directly below the bottom surface of the second hard mask layer 210 and to a position directly below the bottom surface of the first polysilicon gate 202, to expose both the side surface of the bottom portion of each of the fins 201 and the bottom surface of the first polysilicon gate 202 and form a bridge path.

Referring to FIG. 2, a formation area of the second groove is shown by a dashed line box 207.

Referring to FIG. 4C, the formation area of the second groove is shown by a dashed line box 207*a*, and it can be seen that the second groove extends to the bottom of the second hard mask layer 210 and exposes the side surface of the bottom portion of each of the fins 201. It can be seen that the top surface of the isolation dielectric layer 208 is arranged to be lowered than the dashed line EE.

Figure 4D:
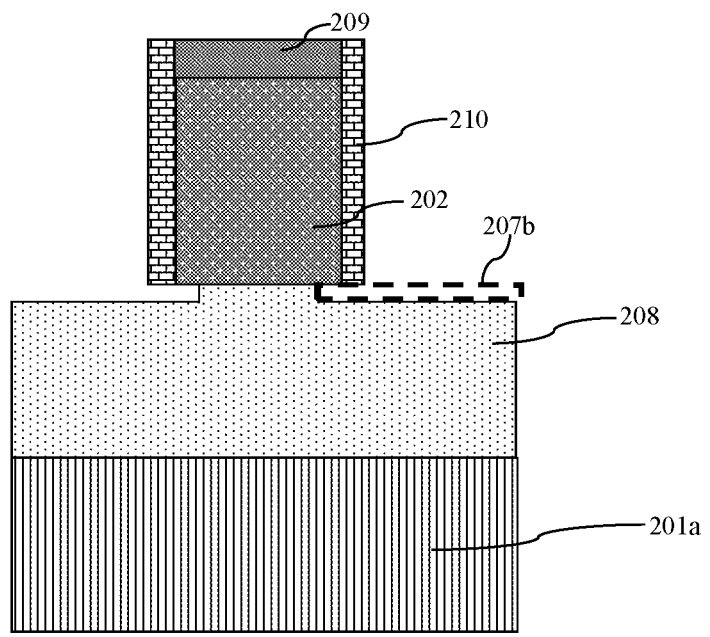

Referring to FIG. 4D, the formation area of the second groove is shown by a dashed line box 207b, and it can be seen that the second groove side-extends to the bottom of the second hard mask layer 210 and eats in partially the bottom surface of the first polysilicon gate 202.

Step 34: Referring to FIGS. 5C and 5D, sacrificial sidewalls 213 are formed on the side surface of the second groove, wherein the sacrificial sidewalls 213 fully fill the bridge paths.

Figure 5A:
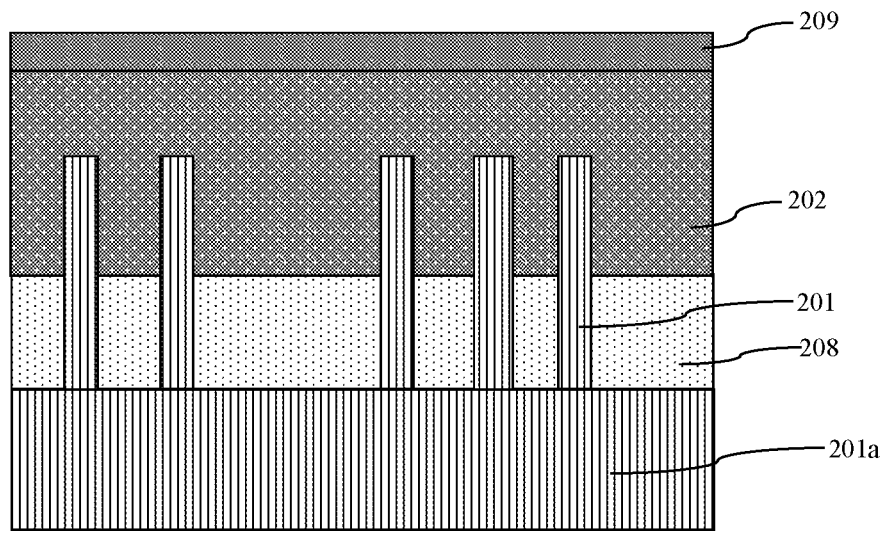
Figure 5B:
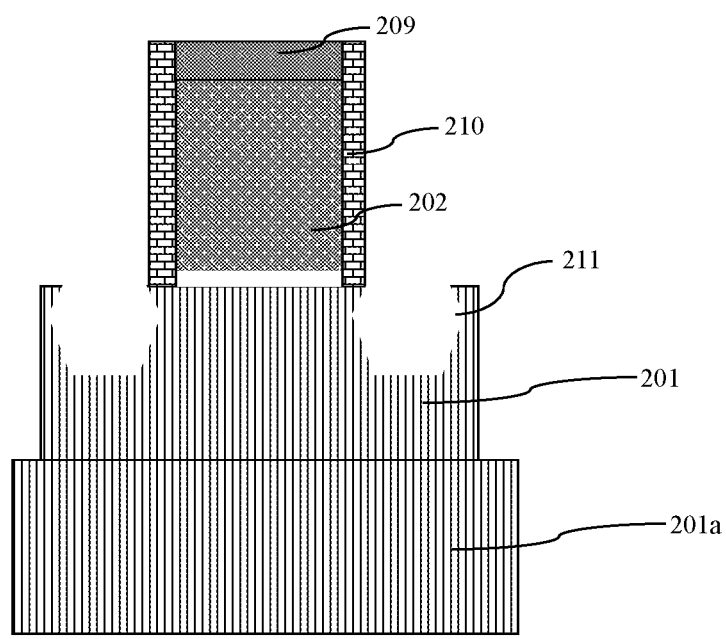
Figure 5C:
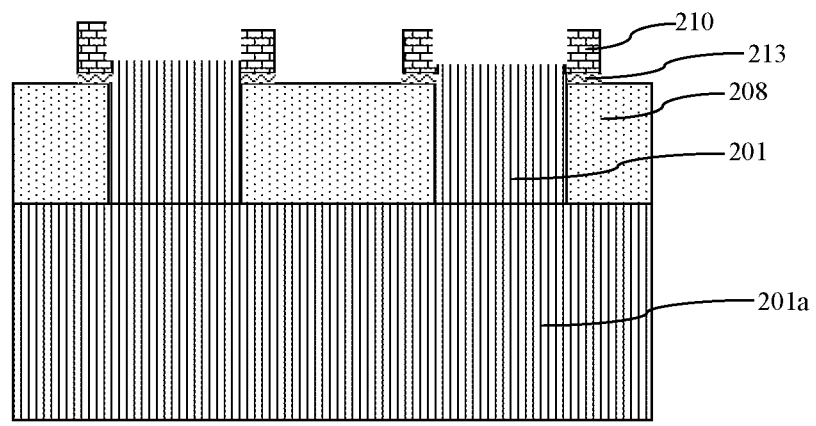
Figure 5D:
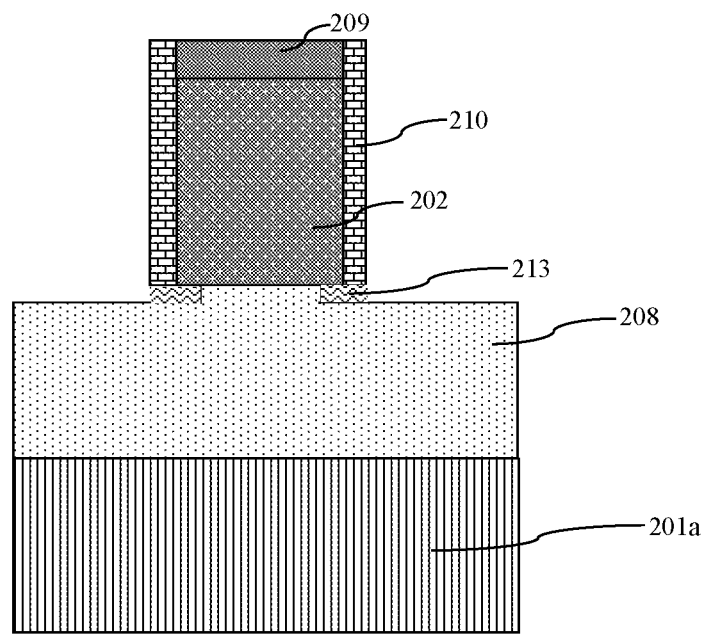

The second groove is not formed in FIGS. 5A and 5B, so the sacrificial sidewalls 213 are not shown in FIGS. 5A and 5B.

In the embodiment of the present application, the step of forming the sacrificial sidewalls 213 include the following.

A material layer of the sacrificial sidewalls 213 are fully deposited. In some examples, a process of depositing the material layer of the sacrificial sidewalls 213 are an ALD process. The material of the material layer of the sacrificial sidewalls 213 includes oxide, nitride, nitrogen oxide, or a low-K material.

The material layer of the sacrificial sidewalls 213 is all etched to form the sacrificial sidewalls 213.

Step 35: Referring to FIGS. 6B and 6C, the first grooves 211 are filled with an epitaxial layer to form an embedded epitaxial layers 212, which then is doped to form the source area and the drain area.

Figure 6A:
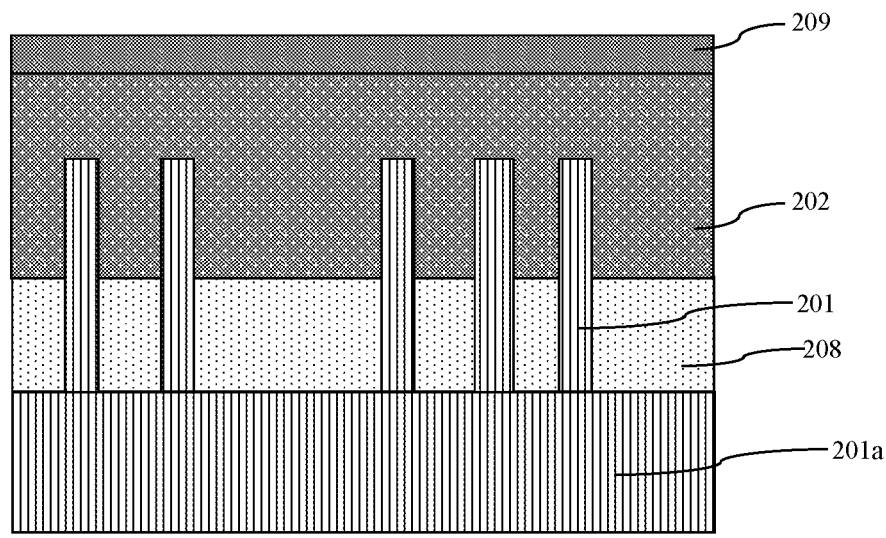
Figure 6B:
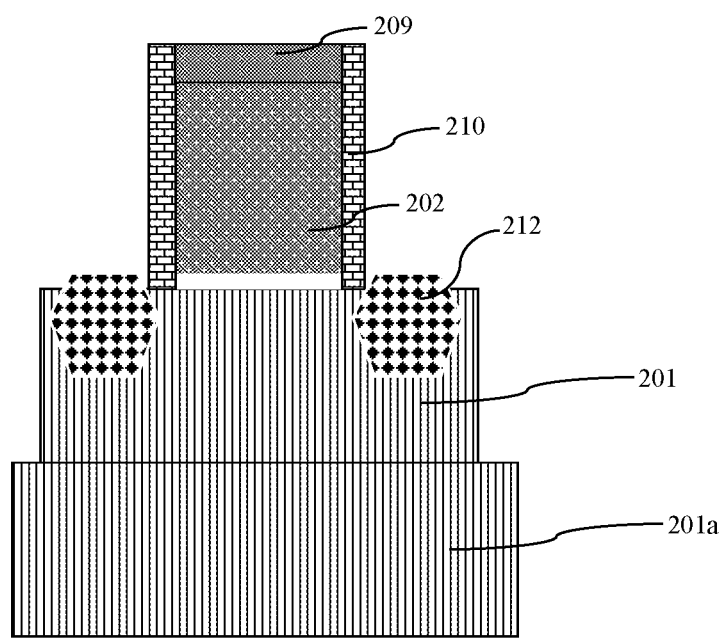
Figure 6C:
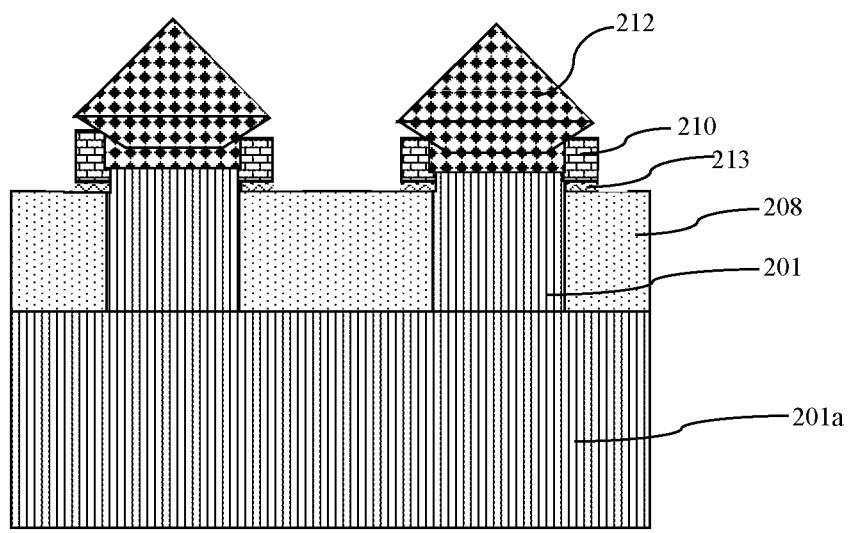
Figure 6D:
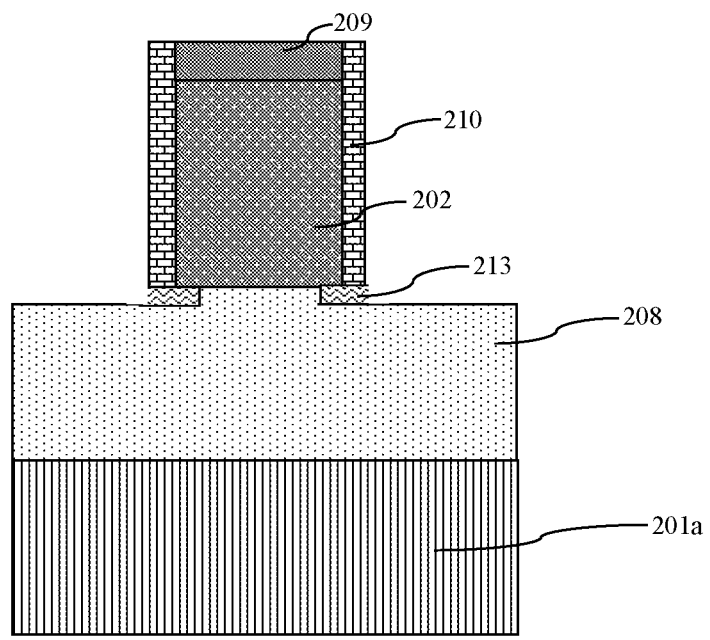

The first grooves are not appear in the cross sectional views in FIGS. 6A and 6D, so the embedded epitaxial layer 212 does not show in FIGS. 6A and 6D.

If the fin field effect transistor is an N-type fin field effect transistor, the embedded epitaxial layer 212 is an embedded SiP epitaxial layer, and the source area and the drain area are both subjected to the N-type heavy doping. Referring to FIG. 2, the embedded SiP epitaxial layer is independently represented by a reference numeral 205.

If the fin field effect transistor is a P-type fin field effect transistor, the embedded epitaxial layer 212 is an embedded SiGe epitaxial layer, and the source area and the drain area are both subjected to P-type heavy doping. Referring to FIG. 2, the embedded SiGe epitaxial layer is independently represented by a reference numeral 206.

If the N-type fin field effect transistor and the P-type fin field effect transistor are both integrated on the semiconductor substrate 201a, the source and drain areas of the N-type fin field effect transistor and the source and drain areas of the P-type fin field effect transistor are formed sequentially in step 3.

During formation of the source and drain areas of the N-type fin field effect transistor, in step 32, a formation area of the N-type fin field effect transistor is opened and a formation area of the P-type fin field effect transistor is covered to protect from patterning.

During formation of the source and drain areas of the P-type fin field effect transistor, in step 32, the formation area of the P-type fin field effect transistor is opened and the formation area of the N-type fin field effect transistor is covered to protect from patterning.

After step 3 is completed, the following steps are performed subsequently:

A contact etch stop layer (CESL) is formed.

A zeroth interlayer film is formed.

A chemical mechanical planarization process is performed to make the surfaces of the zeroth interlayer film and the contact etch stop layer flush with the first polysilicon gate 202, and meanwhile, the first hard mask layer 209 on the surface of the first polysilicon gate 202 is removed.

If the first gate structure is the final gate structure, the first gate structure is exposed subsequently, and then a metal interconnection process is performed.

If the first gate structure serves as a dummy gate structure, a metal gate replacement process is required. The metal gate replacement process includes: removing the first gate structure, and forming a second gate structure in an area where the first gate structure is removed, wherein the second gate structure is formed by stacking a second gate dielectric layer and a metal gate, and the second gate dielectric layer includes a high dielectric-constant layer. Then, a subsequent metal interconnection process is performed.

In the embodiment of the present application, after the etching of the first groove 211 of the embedded epitaxial layer 212 in the source and drain areas and before the filling with the epitaxial layer, the sacrificial sidewalls 213 are provided to fill the bridge path, so as to prevent formation of the epitaxial layer in the bridge path in an epitaxial filling process of the first groove 211, finally avoiding a bridge between the source-drain epitaxial layer and the gate, and thereby preventing the device performance from degrading.

In order to explain that the bridge between the source-drain epitaxial layer and the gate can be avoided according to the embodiment of the present application in further details, a counter example is provided herein for explanation. FIG. 6C1 is a cross sectional view of the structural diagram, according to an existing method for manufacturing a fin field effect transistor, at the same position as that in FIG. 6C in the case of an epitaxially formed embedded layer. FIG. 6D1 is a cross sectional view of the structural diagram, according to the existing method for manufacturing a fin field effect transistor, at the same position as that in FIG. 6D in the case of an epitaxially formed embedded layer. Compared with the method for manufacturing the fin field effect transistor of the embodiment of the present application, in the existing method for manufacturing a fin field effect transistor, step 34 of the method of the embodiment of the present application is omitted, that is, after the second time etching in step 33, the process of filling the first grooves 211 with the epitaxial layer in step 35 is directly performed. Because as the volume required by the embedded epitaxial layer 212 increases, the depth and lateral dimension of the second groove increase, making it easy to expose the surfaces of the first polysilicon gate 202 and each of the fins 201. In the case, in the process of filling with the epitaxial layer in step 35, since the epitaxial layer is formed by selective growth and the selective growth refers to growth on the surfaces of each of the fins 201 having a monocrystalline structure, the growth does not occur outside the surfaces of each of the fins 201. Since the surface of each of the fins 201 in the second groove is exposed, the growth of the epitaxial layer starts from the exposed surface of each of the fins 201 in the second groove. In FIGS. 6C1 and 6D1, the epitaxial layer grown in the second groove is independently represented by a reference numeral 213a. It can be seen from FIG. 6D1 that the epitaxial layer 213a is in contact with the first polysilicon gate 202, thereby causing the defect of the bridge between the source-drain epitaxial layer and the gate. However, in the method of the embodiment of the present application, the bridge between the source-drain epitaxial layer and the gate can be avoided.

The present application is described in detail above via specific embodiments, but these embodiments are not intended to limit the present application. Without departing from the principle of the present application, those skilled in the art can still make many variations and improvements, which should also be considered to fall into the protection scope of the present application.

What is claimed is:

1. A method for manufacturing a fin field effect transistor, comprising following steps:
   step 1: forming fins on a semiconductor substrate, providing a spacing area between two adjacent ones of the fins, wherein the spacing area is filled with an isolation dielectric layer, wherein a top surface of the isolation dielectric layer is configured to be lower than top surfaces of the fins, wherein each one of the fins is vertically divided into a bottom portion and a top portion by a line extending from the top surface of the isolation dielectric layer, so the top portion is located above the line and the bottom portion is located below the line;
   step 2: forming a first gate structure, wherein the first gate structure is formed by stacking a first gate dielectric layer and a first polysilicon gate, wherein a top surface of the first polysilicon gate is provided with a first hard mask layer, and wherein a formation area of the first gate structure is defined by the first hard mask layer, wherein the first gate structure is disposed on a top surface and side surfaces of the fins in a gate formation area, and wherein the first gate structure extends to the top surface of the isolation dielectric layer in the spacing area; and
   step 3: forming a source area and a drain area in each of the fins on two sides of the first gate structure, wherein forming the source area and the drain area comprises following sub-steps:
   step 31: forming a second hard mask layer, wherein the second hard mask layer is disposed on multiple surfaces including a side surface of the first gate structure, a top surface of the first hard mask layer, a top surface and side surfaces of the fins outside the first gate structure, and the top surface of the isolation dielectric layer outside the first gate structure;
   step 32: opening a formation area of the fin field effect transistor, and performing a first time etching on the second hard mask layer, wherein the first time etching removes the second hard mask layer from a top surface of each of the fins to expose the fins, wherein the first time etching also removes the second hard mask layer from the top surface of the isolation dielectric layer to expose the isolation dielectric layer;
   step 33: performing a second time etching by using the second hard mask layer as a mask, wherein the second time etching patterns the exposed fins to form first grooves, wherein the second time etching vertically and horizontally etches the exposed top surface of the isolation dielectric layer to form a second groove, wherein a bottom surface of the second groove is arranged to be lower than a bottom surface of the second hard mask layer, wherein the second groove extends laterally to a position directly under the bottom surface of the second hard mask layer and to a position directly under a bottom surface of the first polysilicon gate, and forms a bridge path between a side surface of the bottom portion of each of the fins and the bottom surface of the first polysilicon gate;
   step 34: forming a sacrificial sidewall on a side surface of the second groove, wherein the sacrificial sidewall fully fills the bridge path; and
   step 35: filling the first groove with an epitaxial layer to form an embedded epitaxial layer, and performing source and drain doping in the embedded epitaxial layer to form the source area and the drain area.

2. The method for manufacturing the fin field effect transistor according to claim 1, wherein the semiconductor substrate comprises a silicon substrate.

3. The method for manufacturing the fin field effect transistor according to claim 1, wherein the isolation dielectric layer is a shallow trench isolation oxide layer.

4. The method for manufacturing the fin field effect transistor according to claim 1, wherein the first hard mask layer is formed by stacking a first oxide layer and a first nitride layer.

5. The method for manufacturing the fin field effect transistor according to claim 1, wherein the second hard mask layer is formed by stacking a second oxide layer and a second nitride layer.

6. The method for manufacturing the fin field effect transistor according to claim 1, wherein in step 34, forming the sacrificial sidewall comprises:
   depositing a material layer of the sacrificial sidewall on the side surface of the second groove; and
   etching the material layer of the sacrificial sidewall to form the sacrificial sidewall.

7. The method for manufacturing the fin field effect transistor according to claim 6, wherein an ALD process is applied to deposit the material layer of the sacrificial sidewall.

8. The method for manufacturing the fin field effect transistor according to claim 6, wherein the material layer of the sacrificial sidewall comprises one of oxide, nitride, nitrogen oxide, or a low-K material.

9. The method for manufacturing the fin field effect transistor according to claim 1, wherein in step 2, the first gate dielectric layer comprises a gate oxide layer or a high dielectric-constant layer.

10. The method for manufacturing the fin field effect transistor according to claim 1, wherein the fin field effect transistor comprises an N-type fin field effect transistor and a P-type fin field effect transistor.

11. The method for manufacturing the fin field effect transistor according to claim 10, wherein the N-type fin field effect transistor comprises an embedded SiP epitaxial layer, and wherein the source area and the drain area of the N-type fin field effect transistor are both formed via N-type heavy doping.

12. The method for manufacturing the fin field effect transistor according to claim 10, wherein the P-type fin field effect transistor comprises an embedded SiGe epitaxial layer, and wherein the source area and the drain area of the P-type fin field effect transistor both comprise P-type heavy doping.

13. The method for manufacturing the fin field effect transistor according to claim 10, wherein if the N-type fin field effect transistor and the P-type fin field effect transistor are both integrated on the semiconductor substrate, the source and drain areas of the N-type fin field effect transistor and the source and drain areas of the P-type fin field effect transistor are formed sequentially in step 3;
   wherein in step 32, a formation area of the N-type fin field effect transistor is opened and a formation area of the P-type fin field effect transistor is covered during formation of the source and drain areas of the N-type fin field effect transistor; and wherein in step 32, the formation area of the P-type fin field effect transistor is opened and the formation area of the N-type fin field effect transistor is covered during formation of the source and drain areas of the P-type fin field effect transistor.

14. The method for manufacturing the fin field effect transistor according to claim 1, wherein the fins are formed by etching the semiconductor substrate in step 1, and in a top view, the fins show as strip structures parallel to each other.

15. The method for manufacturing the fin field effect transistor, wherein the semiconductor substrate further comprises two or more first gate structures each being the same as the first gate structure according to claim 14, wherein in step 2, the two or more of the first gate structures are arranged on rows, wherein all the first gate structures on a same row are connected together to form a gate structure row; and wherein in the top view, the gate structure row and each of the fins are perpendicular to each other.

* * * * *